United States Patent
Liu

(10) Patent No.: US 9,614,009 B2
(45) Date of Patent: *Apr. 4, 2017

(54) ORGANIC P-N JUNCTION BASED ULTRAVIOLET DETECTION DEVICE AND ULTRAVIOLET IMAGE DETECTOR USING SAME

(71) Applicant: Shenzhen China Star Optoelectronics Technology Co., Ltd., Shenzhen, Guangdong (CN)

(72) Inventor: Yawei Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 596 days.

This patent is subject to a terminal disclaimer.

(21) Appl. No.: 14/236,691

(22) PCT Filed: Nov. 27, 2013

(86) PCT No.: PCT/CN2013/087884
§ 371 (c)(1),
(2) Date: Feb. 3, 2014

(87) PCT Pub. No.: WO2015/070485
PCT Pub. Date: May 21, 2015

(65) Prior Publication Data
US 2015/0303240 A1    Oct. 22, 2015

(30) Foreign Application Priority Data
Nov. 15, 2013  (CN) .......................... 2013 1 0574099

(51) Int. Cl.
*H01L 51/00* (2006.01)
*H01L 27/30* (2006.01)
(Continued)

(52) U.S. Cl.
CPC .......... *H01L 27/307* (2013.01); *H01L 51/424* (2013.01); *H01L 51/441* (2013.01);
(Continued)

(58) Field of Classification Search
CPC .... B23K 15/00; B23K 15/0026; C23C 14/24; C23C 14/243; G02F 1/13452;
(Continued)

(56) References Cited

U.S. PATENT DOCUMENTS

2005/0248260 A1* 11/2005 Sellars ................ H01L 51/0017
313/500
2009/0267060 A1* 10/2009 Forrest ................... B82Y 10/00
257/40
(Continued)

FOREIGN PATENT DOCUMENTS

CN           1296645 A      5/2001
CN         101345291 A      1/2009
(Continued)

*Primary Examiner* — Robert Bachner
(74) *Attorney, Agent, or Firm* — Andrew C. Cheng

(57) ABSTRACT

The present invention provides an organic p-n junction based ultraviolet detection device and an ultraviolet image detector using the device. The organic p-n junction based ultraviolet detection device (40) includes: an active glass substrate (42) and a packaging glass substrate (44) that are arranged and opposite to each other, a plurality of organic p-n junctions (43) arranged between the active glass substrate (42) and the packaging glass substrate (44), and a packaging material (48) arranged along a circumferential edge area of the active glass substrate (42) and the packaging glass substrate (44). The plurality of organic p-n junctions (43) is arranged in the form of an array on the active glass substrate (42). The organic p-n junction based ultraviolet detection device and the ultraviolet image detector using the device according to the present invention features simple manufacturing process, low manufacturing cost, and cheap, (Continued)

diversified categories, and wide supply of raw material that can be formed through chemical synthesis. Further, the ultraviolet detection device has a simple structure, a small size, and a light weight and can be formed on a flexible substrate and can expand wide angle of photographing.

13 Claims, 5 Drawing Sheets

(51) Int. Cl.
- *H01L 51/42* (2006.01)
- *H01L 51/44* (2006.01)
- *H04N 5/225* (2006.01)
- *H04N 5/30* (2006.01)
- *H04N 5/335* (2011.01)

(52) U.S. Cl.
CPC ......... *H01L 51/448* (2013.01); *H04N 5/2256* (2013.01); *H04N 5/30* (2013.01); *H04N 5/335* (2013.01); *H01L 51/005* (2013.01); *H01L 51/0047* (2013.01); *H01L 51/0072* (2013.01); *Y02E 10/549* (2013.01); *Y02P 70/521* (2015.11)

(58) Field of Classification Search
CPC .... H01J 2237/002; H01J 37/20; H01J 37/305; H01L 27/14603; H01L 27/14609; H01L 27/14676; H01L 27/1469; H01L 27/3276; H04N 5/03
See application file for complete search history.

(56) References Cited

U.S. PATENT DOCUMENTS

| | | | | |
|---|---|---|---|---|
| 2010/0095705 | A1* | 4/2010 | Burkhalter | C03C 3/21 65/61 |
| 2011/0049367 | A1* | 3/2011 | Forrest | B82Y 10/00 250/338.4 |
| 2016/0118444 | A1* | 4/2016 | Liu | H01L 51/448 250/332 |

FOREIGN PATENT DOCUMENTS

| CN | 101976728 A | 2/2011 |
|---|---|---|
| CN | 102244146 A | 11/2011 |
| CN | 103390630 A | 11/2011 |

\* cited by examiner

ORGANIC P-N JUNCTION BASED ULTRAVIOLET DETECTION DEVICE AND ULTRAVIOLET IMAGE DETECTOR USING SAME

BACKGROUND OF THE INVENTION

1. Field of the Invention

The present invention relates to the field of ultraviolet detection, and in particular to an organic p-n junction based ultraviolet detection device and an ultraviolet image detector using the device.

2. the Related Arts

Ultraviolet detection has been widely used in various applications, such as flame detection and combustion control, solar radiation detection, ultraviolet source control for water treatment and surface disinfection, ultraviolet purification, ultraviolet disinfection, food sterilization control, splitter, and arc detection.

For ultraviolet light of 0.185-0.260 nm wavelength generated by burning flame, a sensitive element that is made of a solid-state substance, such as silicon carbide (SiC) or aluminum nitride ($Al(NO_3)_3$), can be used for detection of the ultraviolet light. Based on the type of explosion protection, the sensitive element is classified as explosion-proof type and stable type. These sensitive elements can be used in the following applications: (1) exploration, production, storage, and unloading of mineral oil and natural gas; (2) manufacture of automobiles and aircrafts and paint spraying chambers; (3) explosives and military supplies; (4) medicines; (5) scrap incineration; and (6) production, storage, and transportation of high-risk industry dyes, such as powder compartment.

Ultraviolet light also has wide applications in medicine and biology and is particularly of unique use in diagnosis of skin diseases recently. The application of ultraviolet detection in diagnosis of skin diseases allows for direct observation of details of lesions and also enables inspection of cancel cells, microorganisms, hemachrome, red blood cells, white blood cells, and cell nuclei. Such detection is not just efficient and precise, it is also direct and clear.

There are also military applications, such as ultraviolet guidance. Although infrared guidance is the main stream guidance of guided missiles, with the maturation of infrared defense technology, the offensive effect achieved with infrared-guided missile will be severely affected. To compete with infrared defense technology, guidance techniques have been developed in a direction toward dual-color guidance, which includes infrared-ultraviolet guidance. When being subjected to infrared interference, a missile can still be guided by ultraviolet radiation that emits from an ultraviolet detector to detect a target toward the target for attack.

For communication, ultraviolet communication, which is a novel way of communication showing great potential for future development, uses ultraviolet radiation to transmit messages and, compared to the regular radio communication, possess advantages of low eavesdropping rate and high interference resistance and enable achievement of near distance secure communication, and, compared to the advance laser communication, possesses advantages of omnidirectional multi-channel communication and oriented communication.

Further, fingerprints and body fluids (such as blood, sperm, and saliva) and substances, such as contraband gunpowder and narcotics show unique characteristics of absorption, reflection, diffraction, and fluorescence. Ultraviolet imaging techniques for police applications use the characteristics of such substances with respect to ultraviolet light to magnify and convert an ultraviolet image taken with an ultraviolet imaging device into a visible light image in order to uncover messages hidden therein, allowing criminal investigation personnel to easily and immediately read for identifying important evidences and also for retrieving evidence through photographing. Digitalized photographing and real-time search of criminals through computer networks allows for greatly shortening of case handling time and enhancing operation efficiency. Compared to the traditional scene investigation for trace searching and retrieval, the ultraviolet imaging systems for police applications, if used for the same jobs, has a primary advantage of enabling fast observation, searching, positioning, evidence-obtaining, and photographing without additional processing. This greatly improves the operation efficiency and also, due to realization of fast and direct searching, allows for identification of some traces and evidences that cannot be identified with the traditional ways. Further, such a method requires no direct contact with evidences and thus greatly improves the retrieval and utilization rate of evidence. All these advantages makes it well appraised in the field of criminal investigation.

Ultraviolet light is divided into middle ultraviolet in the wave range of 0.2-0.3 μm and near ultraviolet in the wave range of 0.3-0.4 nm. The middle ultraviolet light contained in sun light is almost absorbed by the ozone layer of the atmosphere and thus, this wave range of ultraviolet light is often referred to as "solar blind range". Ultraviolet detection technology uses this wave range of the middle ultraviolet light.

Ultraviolet spectrum imaging inspection technology is a novel inspection imaging technique developed in the European and American countries for military purposes. The characteristics of this technique is observing and inspecting ultraviolet signals in the "solar blind range" (240-280 nm) and converting the ultraviolet image signals into visible light image signals for inspection and survey. Using the technology allows for various physical, chemical, and biological phenomena that cannot be detected with the traditional optic instrument. Further, since it operates in the wave range of the "solar blind range", it is not interfered with by sunlight. In other words, instrument employing such technology is operable in sunlight to provide clear images and is reliable and easy to use. There has already been instrument of this kind put into practical use in European and American developed countries and Russia. The instrument of this kind is applicable to the fields of electrical system inspection, space science, and environmental protection researches.

An inorganic ultraviolet imaging inspection system generally comprises: an ultraviolet imaging object lens, an ultraviolet filter, an ultraviolet image enhancing system, a charge coupled device (CCD), and an image displaying system. The principle of operation is illustrated in FIG. 1, in which an ultraviolet signal source 100 is irradiated by background light (including visible lights, ultraviolet light, and infrared light) and what is transmitted from the ultraviolet signal source 100 to an ultraviolet imaging lens 200 includes the ultraviolet light radiating from the ultraviolet signal source 100 itself and components of the background light reflected by the ultraviolet signal source 100. An imaging ray, after passing through the ultraviolet imaging lens 200, is subjected to filtering of a portion of the background light, with a portion of the background lighting still remaining. The ray is then transmitted through an ultraviolet filter 300, which allows for passage of light of the "solar blind range" only, to irradiate a photoelectrical cathode of an ultraviolet image enhancing device 400. Through the enhancement realized with the ultraviolet image enhancing device 400, the ultraviolet signal is enhanced and amplified and converted into and output as a visible light signal. Afterwards, the imaging ray passes through a CCD camera 500 and is finally subjected to signal processing and supplied to a displaying device 600 for observation and recording.

The materials that are used to make inorganic ultraviolet detectors include: first-generation elemental semiconductor materials, second-generation compound semiconductor materials, and third-generation wide band gap semiconductor materials. The first-generation elemental semiconductor materials primarily include silicon (Si); the second-generation compound semiconductor materials primarily include gallium arsenide (GaAs) and indium phosphide (InP); and the third-generation wide band gap semiconductor materials primarily include silicon carbide (SiC), gallium nitride (GaN), zinc oxide (ZnO), and diamond. Due to certain features, including small forbidden band width, large cutoff wave length for long waves of device, and low maximum operation temperature, the first-generation semiconductor materials and the second-generation compound semiconductor materials impose heavy limitations to the characteristics and use of the ultraviolet detectors, making it not meeting the needs for practical applications. The third-generation wide band gap semiconductor materials have various characteristics, including large forbidden band width, high electron drafting saturation speed, small dielectric constant, and excellent thermal conductivity, making they perfectly suitable for electronic devices of radiation resistance, high frequency, large power, and high density integration. The unique forbidden bandwidth also allows them to be used to make light emitters or photo detection device of blue and green lights and ultraviolet light.

Even so, the inorganic ultraviolet detection devices still suffer certain problems, such as high manufacturing cost, complicated operation, high material cost, and incapability of forming thin films on flexible plastic substrates.

SUMMARY OF THE INVENTION

An object of the present invention is to provide an organic p-n junction based ultraviolet detection device, which has a simple structure, a small size, and a small weight, has a simple manufacturing process and a low manufacturing cost, can be manufactured with an organic material that has a low material cost, diversified categories, wide supplies, and can be manufactured with chemical synthesis, can be formed on a flexible substrate, and can expand wide angle of photographing.

Another object of the present invention is to provide an ultraviolet image detector, which has simple structure, a small size, and a low weight, and has a simple manufacturing process and a low manufacturing cost due to using an organic p-n junction based ultraviolet detection device, and can use materials that are low in cost and diversified in categories and can be manufactured with chemical synthesis so that the ultraviolet image detector can have an expanded wide angle of photographing.

To achieve the above objects, the present invention provides an organic p-n junction based ultraviolet detection device, which comprises: an active glass substrate and a packaging glass substrate that are arranged and opposite to and parallel with each other, a plurality of organic p-n junctions arranged between the active glass substrate and the packaging glass substrate, and a packaging material arranged along a circumferential edge area of the active glass substrate and the packaging glass substrate. The plurality of organic p-n junctions is arranged in the form of an array on the active glass substrate.

Each of the organic p-n junctions comprises: an anode formed on the active glass substrate, an organic material layer formed on the anode, and a cathode formed on the organic material layer. The cathode and the packaging glass substrate contact each other.

The organic material layer comprises an organic p-type material and an organic n-type material. The organic p-type material is an ultraviolet light emission material. The organic n-type material is fullerene derivative. The fullerene derivative has a molecular formula as follows:

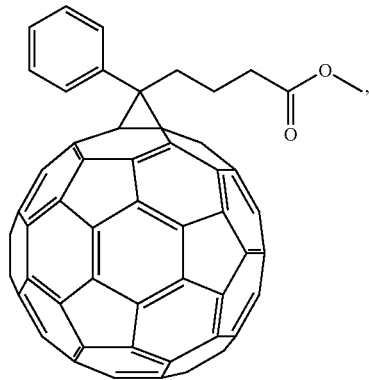 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

the fullerene derivative having an energy level of a highest occupied molecular orbital that is 6.0 eV and an energy level of a lowest unoccupied molecular orbital that is 4.2 eV and carrier mobility that is $10^{-3}$ cm$^2$/V·s.

The ultraviolet light emission material is a carbazole-based ultraviolet light emission material. The carbazole-based ultraviolet light emission material has a molecular formula as follows:

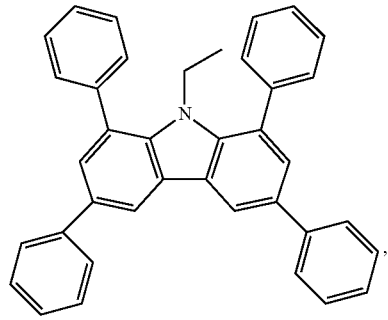 [SMILES: CCn1c2c(-c3ccccc3)cc(-c3ccccc3)cc2c2cc(-c3ccccc3)cc(-c3ccccc3)c21]

the carbazole-based ultraviolet light emission material having a band gap that is 3.25 eV and a peak value of emission spectrum that is 394 nm.

The ultraviolet light emission material is a pentacene-based ultraviolet light emission material. The pentacene-based ultraviolet light emission material has a molecular formula as follows:

the pentacene-based ultraviolet light emission material having a band gap that is 3.48 eV and a peak value of emission spectrum that is 310 nm.

The present invention also provides an organic p-n junction based ultraviolet detection device, which comprises: an active glass substrate and a packaging glass substrate that are arranged and opposite to and parallel with each other, a plurality of organic p-n junctions arranged between the active glass substrate and the packaging glass substrate, and a packaging material arranged along a circumferential edge area of the active glass substrate and the packaging glass substrate, the plurality of organic p-n junctions being arranged in the form of an array on the active glass substrate; wherein each of the organic p-n junctions comprises: an anode formed on the active glass substrate, an organic material layer formed on the anode, and a cathode formed on the organic material layer, the cathode and the packaging glass substrate contacting each other.

The organic material layer comprises an organic p-type material and an organic n-type material. The organic p-type material is an ultraviolet light emission material. The organic n-type material is fullerene derivative. The fullerene derivative has a molecular formula as follows:

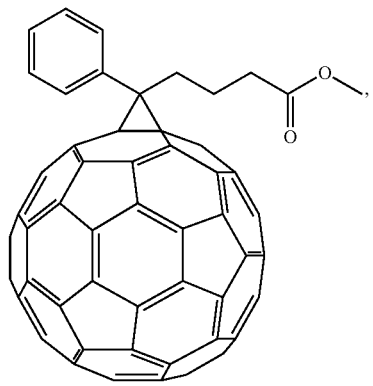 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

the fullerene derivative having an energy level of a highest occupied molecular orbital that is 6.0 eV and an energy level of a lowest unoccupied molecular orbital that is 4.2 eV and carrier mobility that is $10^{-3}$ cm$^2$/V·s.

The ultraviolet light emission material is a carbazole-based ultraviolet light emission material. The carbazole-based ultraviolet light emission material has a molecular formula as follows:

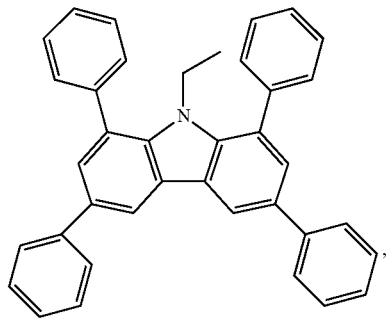 [SMILES: CCn1c2c(-c3ccccc3)cc(-c3ccccc3)cc2c2cc(-c3ccccc3)cc(-c3ccccc3)c21]

the carbazole-based ultraviolet light emission material having a band gap that is 3.25 eV and a peak value of emission spectrum that is 394 nm.

The ultraviolet light emission material is a pentacene-based ultraviolet light emission material. The pentacene-based ultraviolet light emission material has a molecular formula as follows:

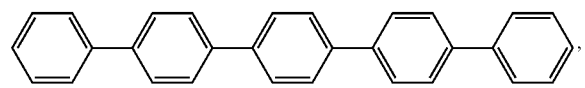

the pentacene-based ultraviolet light emission material having a band gap that is 3.48 eV and a peak value of emission spectrum that is 310 nm.

The present invention further provides an ultraviolet image detector using an organic p-n junction based ultraviolet detection device, comprising: an enclosure, an ultraviolet imaging lens mounted on the enclosure, an ultraviolet filter mounted on the enclosure and opposing the ultraviolet imaging lens, an organic p-n junction based ultraviolet detection device mounted in the enclosure and opposing the ultraviolet filter, a circuit structure mounted in the enclosure and electrically connected to the organic p-n junction based ultraviolet detection device, and a displaying device mounted on the enclosure and electrically connected to the circuit structure, the organic p-n junction based ultraviolet detection device comprising: an active glass substrate and a packaging glass substrate that are arranged and opposite to and parallel with each other, a plurality of organic p-n junctions arranged between the active glass substrate and the packaging glass substrate, and a packaging material arranged along a circumferential edge area of the active glass substrate and the packaging glass substrate, the plurality of organic p-n junctions being arranged in the form of an array on the active glass substrate.

The active glass substrate of the organic p-n junction based ultraviolet detection device is set to face the ultraviolet filter, the enclosure comprising a first opening and a second opening, the ultraviolet imaging lens and the ultraviolet filter being mounted in the first opening, the ultraviolet filter being arranged behind the ultraviolet imaging lens, the displaying device being mounted in the second opening;

the circuit structure comprising: a photoelectric current collection and amplification module electrically connected to the organic p-n junction based ultraviolet detection device and a display driving module electrically connected to the photoelectric current collection and amplification module, the display driving module being also electrically connected to the displaying device.

Each of the organic p-n junctions comprises: an anode formed on the active glass substrate, an organic material layer formed on the anode, and a cathode formed on the organic material layer, the cathode and the packaging glass substrate contacting each other; and the organic material layer comprises an organic p-type material and an organic n-type material, the organic p-type material being an ultraviolet light emission material, the organic n-type material being fullerene derivative, the fullerene derivative having a molecular formula as follows:

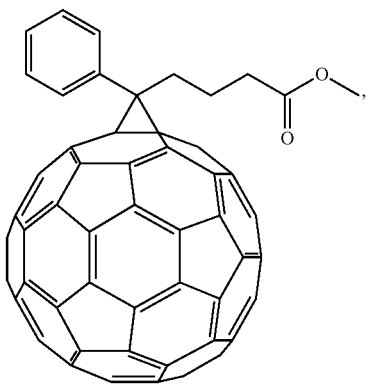 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

the fullerene derivative having an energy level of a highest occupied molecular orbital that is 6.0 eV and an energy level of a lowest unoccupied molecular orbital that is 4.2 eV and carrier mobility that is $10^{-3}$ cm$^2$/V·s.

The ultraviolet light emission material is a carbazole-based ultraviolet light emission material, the carbazole-based ultraviolet light emission material has a molecular formula as follows:

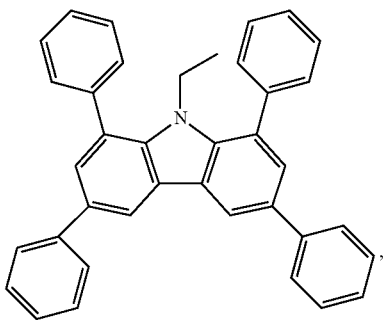 [SMILES: CCn1c2c(-c3ccccc3)cc(-c3ccccc3)cc2c2cc(-c3ccccc3)cc(-c3ccccc3)c21]

the carbazole-based ultraviolet light emission material has a band gap that is 3.25 eV and a peak value of emission spectrum that is 394 nm.

The ultraviolet light emission material is a pentacene-based ultraviolet light emission material, the pentacene-based ultraviolet light emission material has a molecular formula as follows:

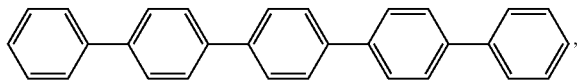 [SMILES: c1ccc(-c2ccc(-c3ccc(-c4ccc(-c5ccccc5)cc4)cc3)cc2)cc1]

the pentacene-based ultraviolet light emission material has a band gap that is 3.48 eV and a peak value of emission spectrum that is 310 nm.

The efficacy of the present invention is that the present invention provides an organic p-n junction based ultraviolet detection device and an ultraviolet image detector using the device, which use organic p-n junctions to absorb radiation photons of ultraviolet light and generates excitons (electron-hole pairs). The excitons are separated at an interface between an organic p-type material and an organic n-type material with electrons moving to a cathode and holes moving to an anode so as to form a photoelectric current. A circuit structure collects the photoelectric current, which is subjected to amplification and then used to finally display a monochromic image that is visible to human eyes on a displaying device. The image has a high contrast and a strong detail recognition power. The ultraviolet detection device has a simple structure, a small size, and a small weight, has a simple manufacturing process and a low manufacturing cost and can be manufactured with a material that is cheap and has diversified categories, wide supplies, and can be manufactured with chemical synthesis. Further, the ultraviolet detection device can be formed on a flexible substrate and can expand wide angle of photographing.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of embodiments of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to preferred embodiments of the present invention and the attached drawings.

Figure 1:
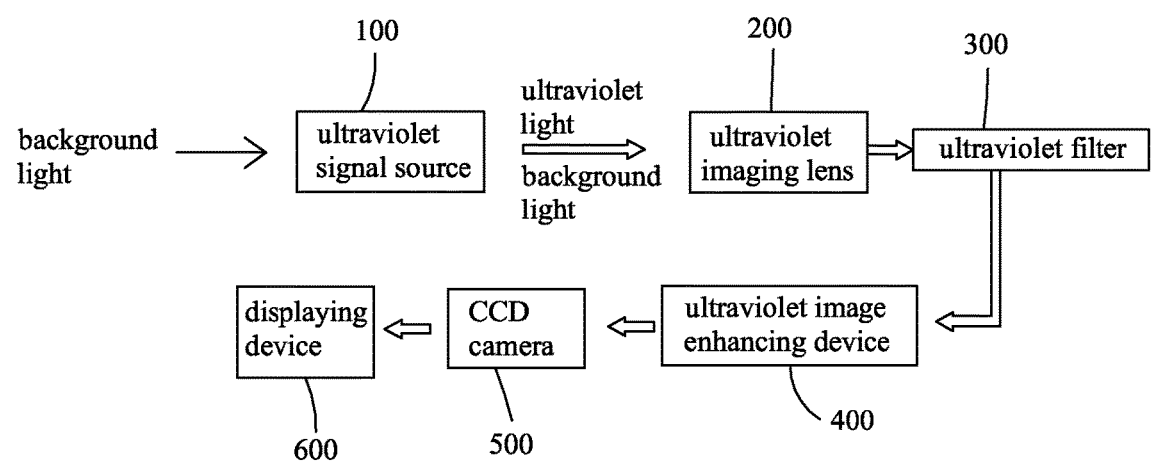
FIG. 1 is a schematic view showing the principle of operation of a conventional inorganic ultraviolet imaging inspection system.
Figure 2:
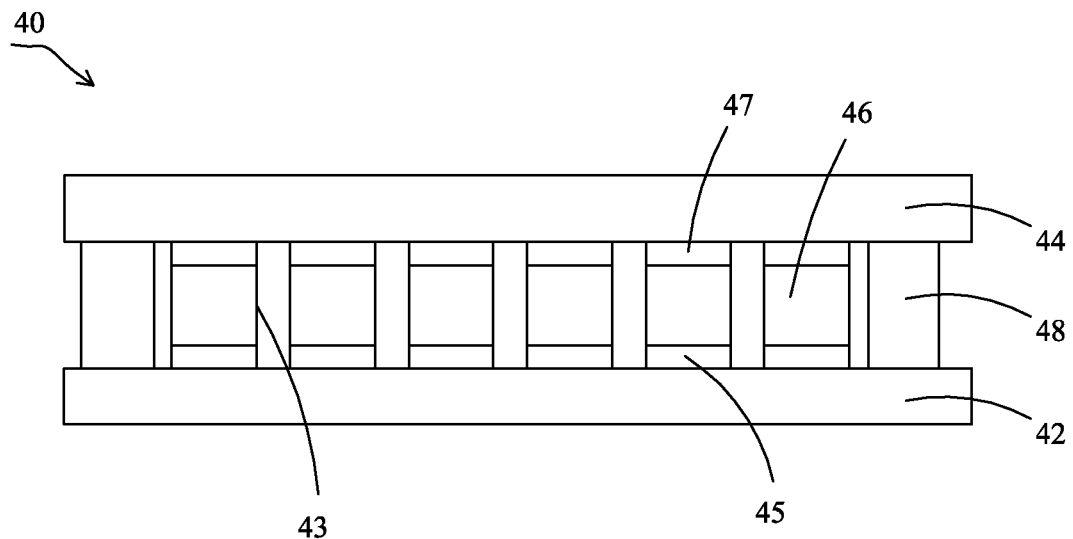
FIG. 2 is a schematic view showing the structure of an organic p-n junction based ultraviolet detection device according to the present invention.
Figure 3:
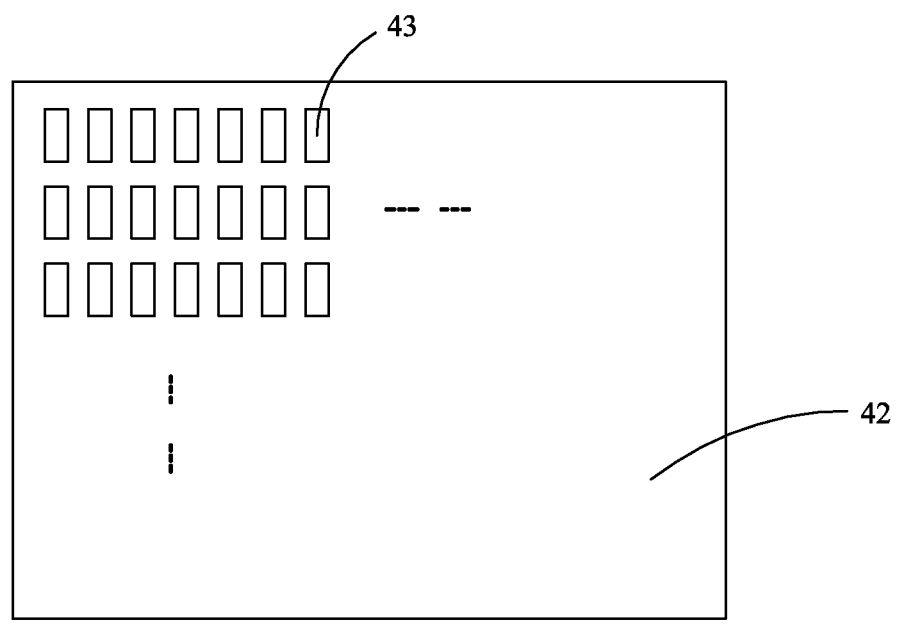
FIG. 3 is a schematic view showing the arrangement of a plurality of organic p-n junctions in an organic p-n junction based ultraviolet detection device according to the present invention.

Referring to FIGS. 2-3, the present invention provides an organic p-n junction based ultraviolet detection device 40, which uses a new-generation solar cell technique-organic solar cell technology-to manufacture a device structure that comprises a pixel dot array. The organic p-n junction based ultraviolet detection device 40 specifically comprises: an active glass substrate 42 and a packaging glass substrate 44 that are arranged and opposite to and parallel with each other, a plurality of organic p-n junctions 43 arranged between the active glass substrate 42 and the packaging glass substrate 44, and a packaging material 48 arranged along a circumferential edge area of the active glass substrate 42 and the packaging glass substrate 44. The plurality of organic p-n junctions 43 is arranged in the form of an array to facilitate enhancement of sensitivity of an ultraviolet image detector that uses the organic p-n junction based ultraviolet detection device 40. Using the packaging material 48 to hermetically bond the active glass substrate 42 and the packaging glass substrate 44 to each other prevents moisture and oxygen from invading the interior of the packaged ultraviolet detection device 40, maintaining the performance of the ultraviolet detection device 40 and extending the lifespan.

Each of the organic p-n junctions 43 comprises: an anode 45 formed on the active glass substrate 42, an organic material layer 46 formed on the anode 45, and a cathode 47 formed on the organic material layer 46, wherein the cathode 47 and the packaging glass substrate 44 contact each other.

Figure 4:
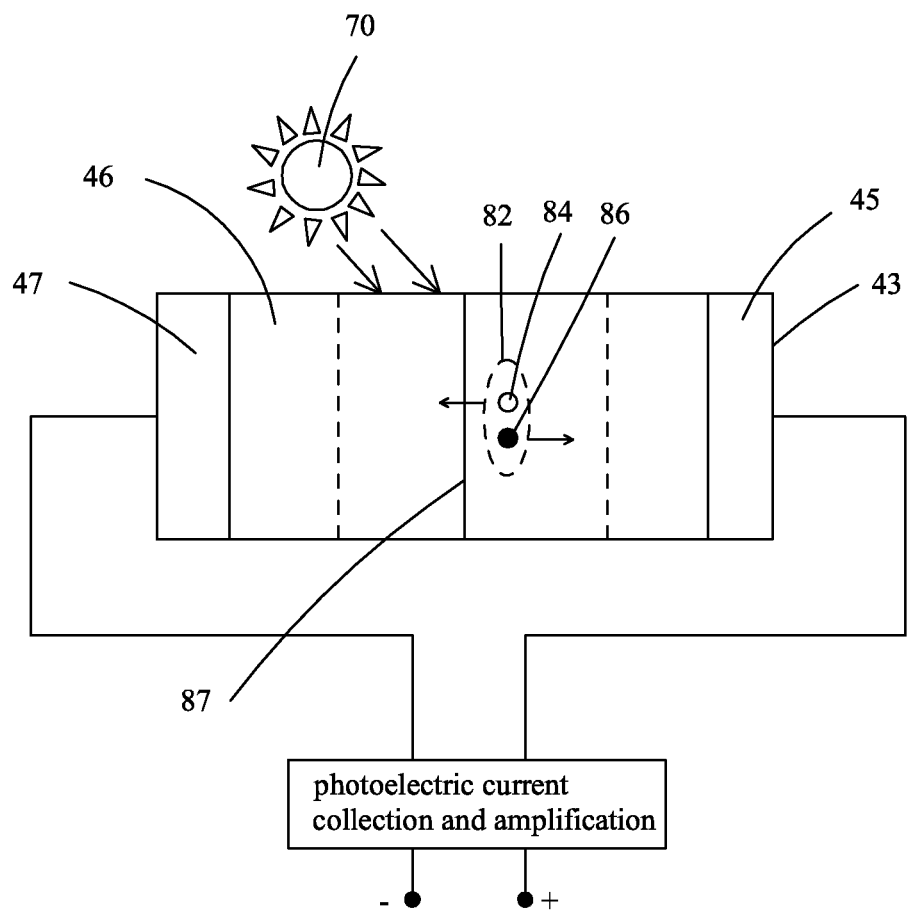
FIG. 4 is a schematic view illustrating the principle of generation of photoelectric current of the organic p-n junction based ultraviolet detection device according to the present invention.
Figure 5:
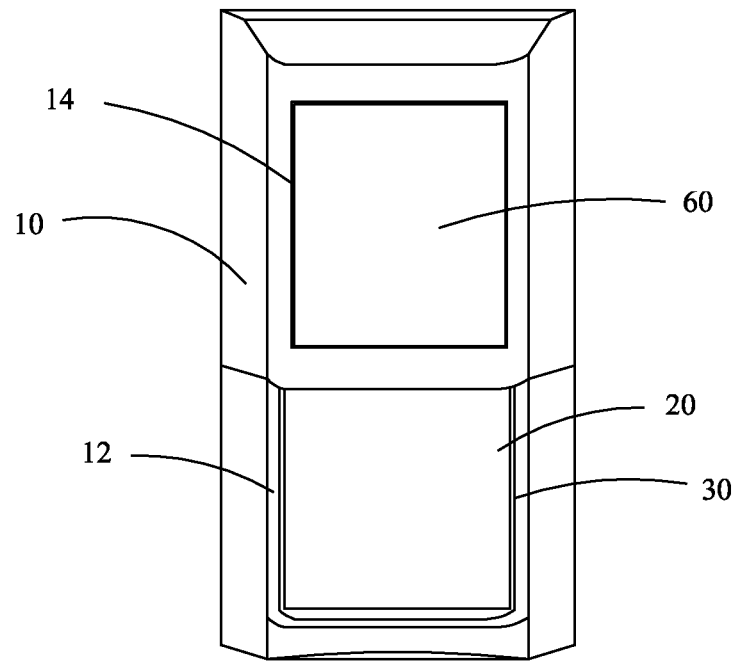
FIG. 5 is a perspective view showing an ultraviolet image detector according to the present invention.
Figure 6:
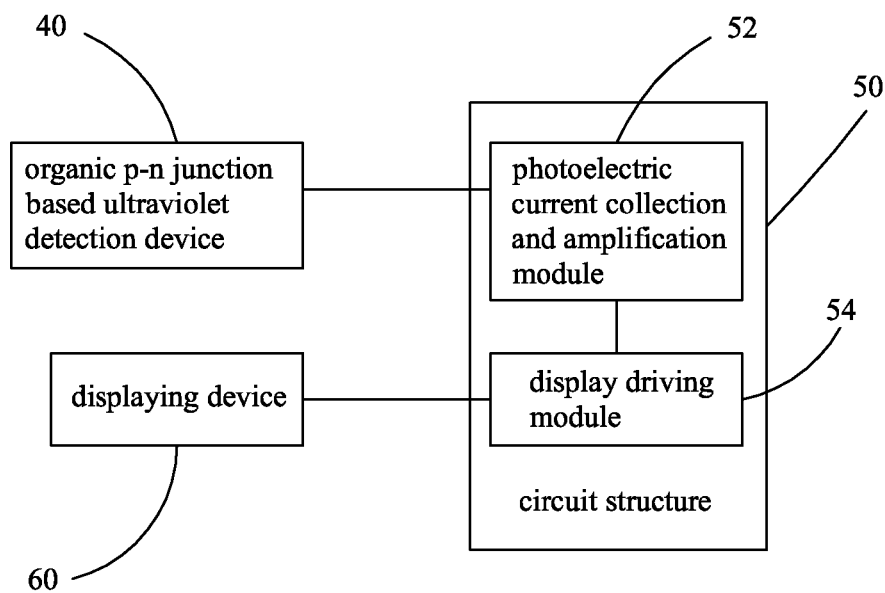
FIG. 6 is a schematic view showing the connection of an electrical circuit of the ultraviolet image detector according to the present invention.

The organic material layer 46 includes an organic p-type material and an organic n-type material. Referring to FIG. 4, the organic p-type material and the organic n-type material form therebetween an interface 87. The organic material layer 46 absorbs external ultraviolet light 70 and forms excitons 82 (electrons-hole pairs). The excitons 82 can be acted on by an external voltage to divide, at the interface 87, into holes 84 and electrons 86, where the electrons 86 move to the cathode 47 and the holes 84 move to the anode 45, so as to generate a photoelectric current.

The organic p-type material is an ultraviolet light emission material, and the ultraviolet light emission material is preferably a carbazole-based ultraviolet light emission material, of which the molecular formula is:

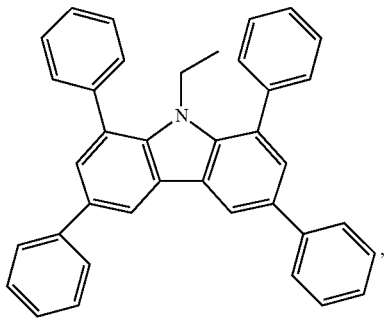 [SMILES: CCn1c2c(-c3ccccc3)cc(-c3ccccc3)cc2c2cc(-c3ccccc3)cc(-c3ccccc3)c21]

which has a band gap of 3.25 eV and a peak value of emission spectrum being 394 nm. The ultraviolet light emission material can alternatively be a pentacene-based ultraviolet light emission material, of which the molecular formula is:

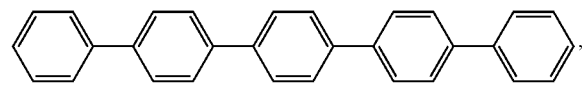

which has a band gap of 3.48 eV and a peak value of emission spectrum being 310 nm.

The organic n-type material is preferably the fullerene derivative (PCBM), of which the molecular formula is:

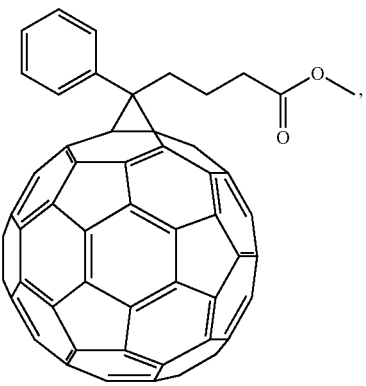 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

which has excellent solubility and also has better electron transportation capability and higher electron affinity, the energy level of HOMO (highest occupied molecular orbital) being 6.0 eV, the energy level of LUMO (lowest unoccupied molecular orbital) being 4.2 eV, and carrier mobility being $10^{-3}$ cm$^2$/V·s, so as to make it an excellent electron transportation material for solar cells.

Referring to FIGS. 2-6, the present invention also provides an ultraviolet image detector that uses the organic p-n junction based ultraviolet detection device and comprises: an enclosure 10, an ultraviolet imaging lens 20 mounted on the enclosure 10, an ultraviolet filter 30 mounted on the enclosure 10 and opposing the ultraviolet imaging lens 20, an organic p-n junction based ultraviolet detection device 40 mounted in the enclosure 10 and opposing the ultraviolet filter 30, a circuit structure 50 mounted in the enclosure 10 and electrically connected to the organic p-n junction based ultraviolet detection device 40, and a displaying device 60 mounted on the enclosure 10 and electrically connected to the circuit structure 50. The organic p-n junction based ultraviolet detection device 40 comprises: an active glass substrate 42 and a packaging glass substrate 44 that are arranged and opposite to each other, a plurality of organic p-n junctions 43 arranged between the active glass substrate 42 and the packaging glass substrate 44, and a packaging material 48 arranged along a circumferential edge area of the active glass substrate 42 and the packaging glass substrate 44. The plurality of organic p-n junctions 43 is arranged in the form of an array to facilitate enhancement of performance of the ultraviolet image detector. Using the packaging material 48 to hermetically bond the active glass substrate 42 and the packaging glass substrate 44 to each other prevents moisture and oxygen from invading the interior of the packaged ultraviolet detection device 40, maintaining the performance of the ultraviolet detection device 40 and extending the lifespan.

The active glass substrate 42 of the organic p-n junction based ultraviolet detection device 40 is set to face the ultraviolet filter 30, whereby external ultraviolet light 70, which passes through the ultraviolet imaging lens 20 and is filtered by the ultraviolet filter 30, gets into the organic p-n junction based ultraviolet detection device 40 from the active glass substrate 42. The enclosure 10 comprises a first opening 12 and a second opening 14 formed therein. The ultraviolet imaging lens 20 and the ultraviolet filter 30 are both mounted in the first opening 12 and the ultraviolet filter 30 is arranged behind the ultraviolet imaging lens 20. External ultraviolet light 70 may directly irradiates a surface of the ultraviolet imaging lens 20. The displaying device 60 is selectively mounted in the second opening 14 to display the intensity of the ultraviolet light 70 detected by the ultraviolet image detector, meaning displaying a monochromic image that is visible to human eyes. Further, the displaying device 60 may alternatively made separable from the enclosure 10 as a stand-alone device so as to be mountable at any location that can be easily observed by a user to enhance the operability thereof.

The circuit structure 50 comprises: a photoelectric current collection and amplification module 52 electrically connected to the organic p-n junction based ultraviolet detection device 40 and a display driving module 54 electrically connected to the photoelectric current collection and amplification module 52. The organic p-n junction based ultraviolet detection device 40, when irradiated by the ultraviolet light 70, generates excitons 82 (electron-hole pairs). The excitons 82 eventually separate and generate a photoelectric current, whereby the photoelectric current collection and amplification module 52 detects the magnitude of the photoelectric current, namely detecting the intensity of the ultraviolet light 70 that irradiates the organic p-n junction based ultraviolet detection device 40, and amplifies and transmits the photoelectric current to the display driving module 54. The display driving module 54 is also electrically connected to the displaying device 60 and, according to the signal of the photoelectric current to drive the displaying device 60 to display a monochromic image. The brightness intensity of the monochromic image corresponds to the intensity of the ultraviolet light 70 that irradiates a corresponding area of the organic p-n junction based ultraviolet detection device 40.

Each of the organic p-n junctions 43 comprises: an anode 45 formed on the active glass substrate 42, an organic material layer 46 formed on the anode 45, and a cathode 47 formed on the organic material layer 46, wherein the cathode 47 and the packaging glass substrate 44 contact each other. The organic material layer 46 includes an organic p-type material and an organic n-type material. Referring to FIG. 4, the organic p-type material and the organic n-type material form therebetween an interface 87. The organic material layer 46 absorbs external ultraviolet light 70 and forms excitons 82 (electrons-hole pairs). The excitons 82 can be acted on by an external voltage to divide, at the interface 87, into holes 84 and electrons 86, where the electrons 86 move to the cathode 47 and the holes 84 move to the anode 45, so as to generate a photoelectric current. The photoelectric current flows through the circuit to the photoelectric current collection and amplification module 52, by which the photoelectric current is amplified. The photoelectric current of each of the organic p-n junctions 43, after being collected and amplified, is finally applied to the displaying device 60 to form a monochromic image. The electrical current generated by each of the organic p-n junctions 43 has a magnitude corresponding to the brightness intensity of a corresponding area of the displaying device 60. The organic p-type material is an ultraviolet light emission material, and the ultraviolet light emission material is preferably a carbazole-based ultraviolet light emission material, of which the molecular formula is:

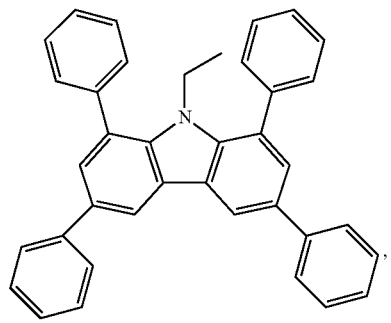 [SMILES: CCn1c2c(-c3ccccc3)cc(-c3ccccc3)cc2c2cc(-c3ccccc3)cc(-c3ccccc3)c21]

which has a band gap of 3.25 eV and a peak value of emission spectrum being 394 nm. The ultraviolet light emission material can alternatively be a pentacene-based ultraviolet light emission material, of which the molecular formula is:

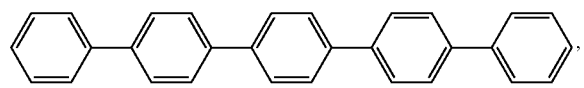 [SMILES: c1ccc(-c2ccc(-c3ccc(-c4ccc(-c5ccccc5)cc4)cc3)cc2)cc1]

which has a band gap of 3.48 eV and a peak value of emission spectrum being 310 nm.

The organic n-type material is preferably the fullerene derivative (PCBM), of which the molecular formula is:

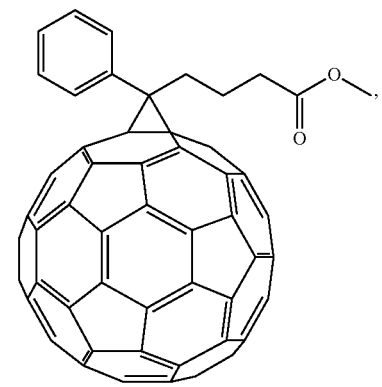 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

which has excellent solubility and also has better electron transportation capability and higher electron affinity, the energy level of HOMO (highest occupied molecular orbital) being 6.0 eV, the energy level of LUMO (lowest unoccupied molecular orbital) being 4.2 eV, and carrier mobility being $10^{-3}$ cm$^2$/V·s, so as to make it an excellent electron transportation material for solar cells.

Figure 7:
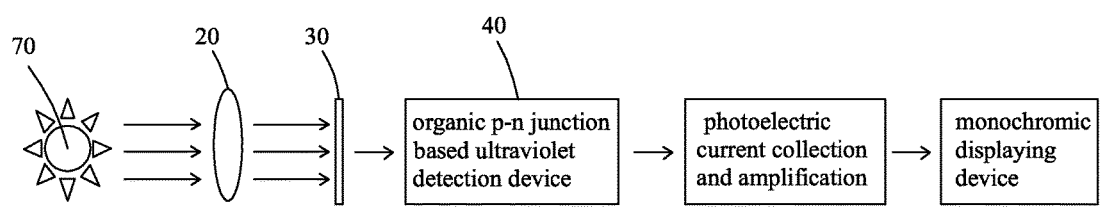
FIG. 7 is a schematic view illustrating the principle of operation of the ultraviolet image detector according to the present invention.

Referring to FIG. 7, a specific way to put the present invention into practice is as follows: The ultraviolet imaging lens 20 first filters out a portion of the external ultraviolet light 70, and then, the ultraviolet filter 30 filter out visible light (wavelength ranging from 390 nm to 760 nm) and infrared wave band, with only ultraviolet light in the wave range of "the solar blind range" (240 nm-280 nm) preserved.

The organic p-n junction based ultraviolet detection device 40 absorbs radiation photons of the ultraviolet light in the wave range of "the solar blind range" and generates excitons 82 (electron-hole pairs), whereby the excitons 82 are separated at an interface between an organic p-type material and an organic n-type material with electrons 86 moving to a cathode and holes 84 moving to an anode. The circuit structure 50 collects the photoelectric current, which is subjected to amplification and then used to finally display a monochromic image that is visible to human eyes on the displaying device 60. The image has a high contrast and a strong detail recognition power. The ultraviolet detection device 40 has a simple structure, a small size, and a small weight, has a simple manufacturing process and a low manufacturing cost and can be manufactured with a material that is cheap and has diversified categories, wide supplies, and can be manufactured with chemical synthesis. Further, the ultraviolet detection device 40 can be formed on a flexible substrate and can expand wide angle of photographing.

In summary, the present invention provides an organic p-n junction based ultraviolet detection device and an ultraviolet image detector using the device, which use organic p-n junctions to absorb radiation photons of ultraviolet light and generates excitons (electron-hole pairs). The excitons are separated at an interface between an organic p-type material and an organic n-type material with electrons moving to a cathode and holes moving to an anode so as to form a photoelectric current. A circuit structure collects the photoelectric current, which is subjected to amplification and then used to finally display a monochromic image that is visible to human eyes on a displaying device. The image has a high contrast and a strong detail recognition power. The ultraviolet detection device has a simple structure, a small size, and a small weight, has a simple manufacturing process and a low manufacturing cost and can be manufactured with a material that is cheap and has diversified categories, wide supplies, and can be manufactured with chemical synthesis. Further, the ultraviolet detection device can be formed on a flexible substrate and can expand wide angle of photographing.

Based on the description given above, those having ordinary skills in the art may easily contemplate various changes and modifications of the technical solution and technical ideas of the present invention and all these changes and modifications are considered within the protection scope of right for the present invention.

What is claimed is:

1. An organic p-n junction based ultraviolet detection device, comprising: an active glass substrate and a packaging glass substrate that are arranged and opposite to and parallel with each other, a plurality of organic p-n junctions arranged between the active glass substrate and the packaging glass substrate, and a packaging material arranged along a circumferential edge area of the active glass substrate and the packaging glass substrate, the plurality of organic p-n junctions being arranged in the form of an array on the active glass sub state;
   wherein each of the organic p-n junctions comprises: an anode formed on the active glass substrate, an organic material layer formed on the anode, and a cathode formed on the organic material layer, the cathode and the packaging glass substrate contacting each other; and
   wherein the organic material layer comprises an organic p-type material and an organic n-type material, and the organic p-type material comprises an ultraviolet light emission material having emission spectrum that is less than 400 nm.

2. The organic p-n junction based ultraviolet detection device as claimed in claim 1, wherein the organic n-type material comprises fullerene derivative, the fullerene derivative having a molecular formula as follows:

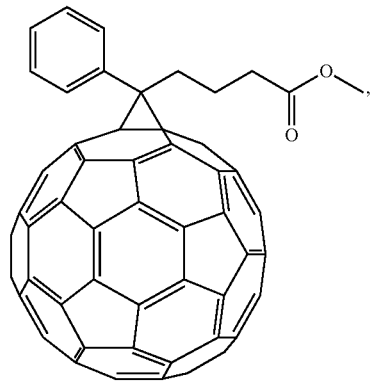 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

the fullerene derivative having an energy level of a highest occupied molecular orbital that is 6.0 eV and an energy level of a lowest unoccupied molecular orbital that is 4.2 eV and carrier mobility that is $10^{-3}$ cm$^2$/V·s.

3. The organic p-n junction based ultraviolet detection device as claimed in claim 2, wherein the ultraviolet light emission material is a carbazole-based ultraviolet light emission material, the carbazole-based ultraviolet light emission material having a molecular formula as follows:

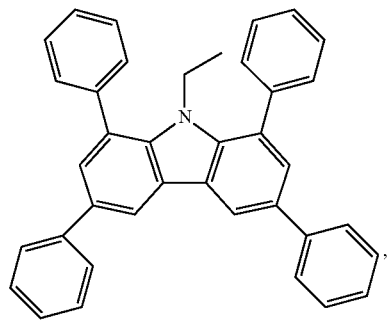 [SMILES: CCn1c2c(-c3ccccc3)cc(-c3ccccc3)cc2c2cc(-c3ccccc3)cc(-c3ccccc3)c21]

the carbazole-based ultraviolet light emission material having a band gap that is 3.25 eV and a peak value of emission spectrum that is 394 nm.

4. The organic p-n junction based ultraviolet detection device as claimed in claim 2, wherein the ultraviolet light emission material is a pentacene-based ultraviolet light emission material, the pentacene-based ultraviolet light emission material having a molecular formula as follows:

the pentacene-based ultraviolet light emission material having a band gap that is 3.48 eV and a peak value of emission spectrum that is 310 nm.

5. An organic p-n junction based ultraviolet detection device, comprising: an active glass substrate and a packaging glass substrate that are arranged and opposite to and parallel with each other, a plurality of organic p-n junctions arranged between the active glass substrate and the packaging glass substrate, and a packaging material arranged along a circumferential edge area of the active glass substrate and the packaging glass substrate, the plurality of organic p-n junctions being arranged in the form of an array on the active glass substrate;

wherein each of the organic p-n junctions comprises: an anode formed on the active glass substrate, an organic material layer formed on the anode, and a cathode formed on the organic material layer, the cathode and the packaging glass substrate contacting each other; and wherein the organic material layer comprises an organic p-type material and an organic n-type material, and the organic p-type material comprises an ultraviolet light emission material having emission spectrum that is less than 400 nm.

6. The organic p-n junction based ultraviolet detection device as claimed in claim 5, wherein the organic n-type material comprises fullerene derivative, the fullerene derivative having a molecular formula as follows:

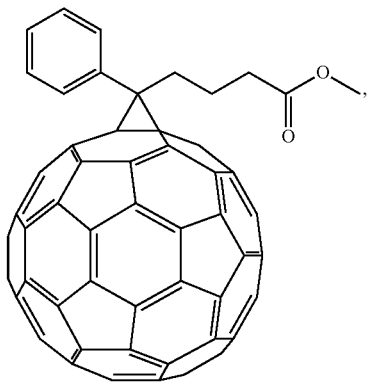 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

the fullerene derivative having an energy level of a highest occupied molecular orbital that is 6.0 eV and an energy level of a lowest unoccupied molecular orbital that is 4.2 eV and carrier mobility that is $10^{-3}$ cm$^2$/V·s.

7. The organic p-n junction based ultraviolet detection device as claimed in claim 6, wherein the ultraviolet light emission material is a carbazole-based ultraviolet light emission material, the carbazole-based ultraviolet light emission material having a molecular formula as follows:

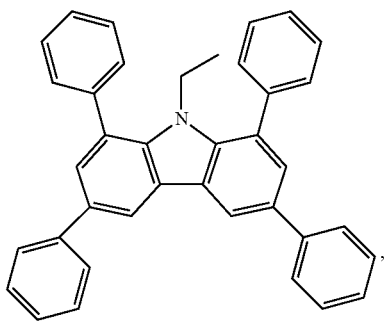 [SMILES: CCn1c2c(-c3ccccc3)cc(-c3ccccc3)cc2c2cc(-c3ccccc3)cc(-c3ccccc3)c21]

the carbazole-based ultraviolet light emission material having a band gap that is 3.25 eV and a peak value of emission spectrum that is 394 nm.

8. The organic p-n junction based ultraviolet detection device as claimed in claim 6, wherein the ultraviolet light emission material is a pentacene-based ultraviolet light emission material, the pentacene-based ultraviolet light emission material having a molecular formula as follows:

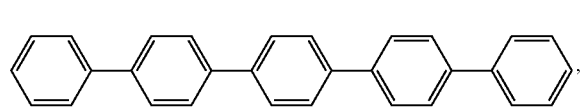 [SMILES: c1ccc(-c2ccc(-c3ccc(-c4ccc(-c5ccccc5)cc4)cc3)cc2)cc1]

the pentacene-based ultraviolet light emission material having a band gap that is 3.48 eV and a peak value of emission spectrum that is 310 nm.

9. The An ultraviolet image detector using an organic p-n junction based ultraviolet detection device, comprising: an enclosure, an ultraviolet imaging lens mounted on the enclosure, an ultraviolet filter mounted on the enclosure and opposing the ultraviolet imaging lens, an organic p-n junction based ultraviolet detection device mounted in the enclosure and opposing the ultraviolet filter, a circuit structure mounted in the enclosure and electrically connected to the organic p-n junction based ultraviolet detection device, and a displaying device mounted on the enclosure and electrically connected to the circuit structure, the organic p-n junction based ultraviolet detection device comprising: an active glass substrate and a packaging glass substrate that are arranged and opposite to and parallel with each other, a plurality of organic p-n junctions arranged between the active glass substrate and the packaging glass substrate, and a packaging material arranged along a circumferential edge area of the active glass substrate and the packaging glass substrate, the plurality of organic p-n junctions being arranged in the form of an array on the active glass substrate;

wherein each of the organic p-n junctions comprises: an anode formed on the active glass substrate, an organic material layer formed on the anode, and a cathode formed on the organic material layer, the cathode and the packaging glass substrate contacting each other; and wherein the organic material layer comprises an organic p-type material and an organic n-type material, and the organic p-type material comprises an ultraviolet light emission material having emission spectrum that is less than 400 nm.

10. The ultraviolet image detector using the organic p-n junction based ultraviolet detection device as claimed in claim 9, wherein the active glass substrate of the organic p-n junction based ultraviolet detection device is set to face the ultraviolet filter, the enclosure comprising a first opening and a second opening, the ultraviolet imaging lens and the ultraviolet filter being mounted in the first opening, the ultraviolet filter being arranged behind the ultraviolet imaging lens, the displaying device being mounted in the second opening;

the circuit structure comprising: a photoelectric current collection and amplification module electrically connected to the organic p-n junction based ultraviolet detection device and a display driving module electrically connected to the photoelectric current collection and amplification module, the display driving module being also electrically connected to the displaying device.

11. The ultraviolet image detector using the organic p-n junction based ultraviolet detection device as claimed in claim 9, wherein the organic n-type material comprises fullerene derivative, the fullerene derivative having a molecular formula as follows:

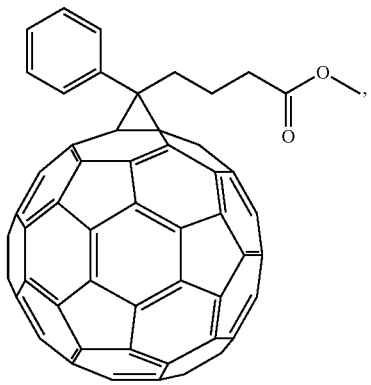 [SMILES: COC(=O)CCCC1(c2ccccc2)C2c3cc4c5c6c(cc7cc8c9c%10c(cc%11cc%12c%13c(c%14c3c5c3c%14c5c%13c%11c%10c5c5c9c7c6c35)C21C%12)CC8)CC4]

the fullerene derivative having an energy level of a highest occupied molecular orbital that is 6.0 eV and an energy level of a lowest unoccupied molecular orbital that is 4.2 eV and carrier mobility that is $10^{-3}$ cm$^2$/V·s.

12. The ultraviolet image detector using the organic p-n junction based ultraviolet detection device as claimed in claim 11, wherein the ultraviolet light emission material is a carbazole-based ultraviolet light emission material, the carbazole-based ultraviolet light emission material has a molecular formula as follows:

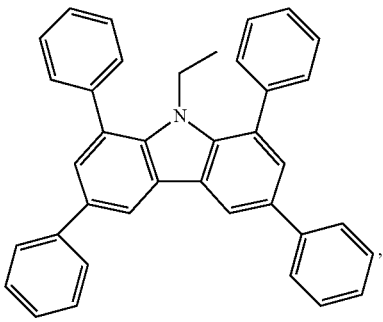 [SMILES: CCn1c2c(-c3ccccc3)cc(-c3ccccc3)cc2c2cc(-c3ccccc3)cc(-c3ccccc3)c21]

the carbazole-based ultraviolet light emission material has a band gap that is 3.25 eV and a peak value of emission spectrum that is 394 nm.

13. The ultraviolet image detector using the organic p-n junction based ultraviolet detection device as claimed in claim 11, wherein the ultraviolet light emission material is a pentacene-based ultraviolet light emission material, the pentacene-based ultraviolet light emission material has a molecular formula as follows:

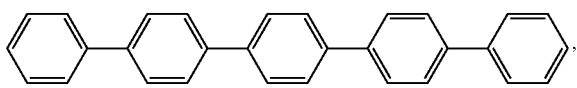

the pentacene-based ultraviolet light emission material has a band gap that is 3.48 eV and a peak value of emission spectrum that is 310 nm.

* * * * *